(12) United States Patent
Inda

(10) Patent No.: US 10,790,117 B2
(45) Date of Patent: Sep. 29, 2020

(54) ION IMPLANTATION APPARATUS AND MEASUREMENT DEVICE

(71) Applicant: SUMITOMO HEAVY INDUSTRIES ION TECHNOLOGY CO., LTD., Tokyo (JP)

(72) Inventor: Yoshiaki Inda, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/363,678

(22) Filed: Mar. 25, 2019

(65) Prior Publication Data

US 2019/0295818 A1    Sep. 26, 2019

(30) Foreign Application Priority Data

Mar. 26, 2018  (JP) ................. 2018-057573

(51) Int. Cl.
  *H01J 37/31* (2006.01)
  *H01J 37/244* (2006.01)
  *H01J 37/317* (2006.01)

(52) U.S. Cl.
  CPC ........ *H01J 37/3171* (2013.01); *H01J 37/244* (2013.01); *H01J 2237/152* (2013.01);
  (Continued)

(58) Field of Classification Search
  CPC ... H01J 2237/24528; H01J 2237/31701; H01J 37/1474; H01J 37/147; H01J 2237/024;
  (Continued)

(56) References Cited

U.S. PATENT DOCUMENTS 9,269,541 B2 *  2/2016  Inada .................. H01J 37/3171
9,293,295 B2 *  3/2016  Yagita .................. H01J 37/147
(Continued)

FOREIGN PATENT DOCUMENTS

JP      4438325 B2    3/2010
JP      5181249 B2    4/2013
(Continued)

*Primary Examiner* — David A Vanore

(74) *Attorney, Agent, or Firm* — Michael Best & Friedrich LLP

(57) ABSTRACT

An ion implantation apparatus includes a first angle measuring instrument configured to measure angle information on an ion beam in a first direction, a second angle measuring instrument configured to measure angle information on the ion beam in a second direction, a relative movement mechanism configured to change relative positions of the first angle measuring instrument and the second angle measuring instrument with respect to the ion beam in a predetermined relative movement direction, and a control device configured to calculate angle information on the ion beam in a third direction perpendicular to both a beam traveling direction and the relative movement direction based on the angle information on the ion beam in the first direction measured by the first angle measuring instrument and the angle information on the ion beam in the second direction measured by the second angle measuring instrument.

18 Claims, 10 Drawing Sheets

(52) U.S. Cl.
CPC ............. *H01J 2237/24528* (2013.01); *H01J 2237/24535* (2013.01); *H01J 2237/24578* (2013.01); *H01J 2237/31701* (2013.01)

(58) Field of Classification Search
CPC ......... H01J 2237/121; H01J 2237/2446; H01J 2237/24521; H01J 2237/24542; H01J 37/023; H01J 37/1471; H01L 22/26
USPC ................................ 250/492.21, 397, 396 R
See application file for complete search history.

(56) References Cited

U.S. PATENT DOCUMENTS

| | | | |
|---|---|---|---|
| 9,368,327 B2* | 6/2016 | Kabasawa | H01J 37/3007 |
| 9,373,481 B2* | 6/2016 | Kato | H01J 37/3171 |
| 10,283,422 B2* | 5/2019 | Kariya | H01J 37/08 |
| 2006/0219955 A1 | 10/2006 | Ray | |
| 2006/0289798 A1* | 12/2006 | Cummings | G01B 15/00 |
| | | | 250/492.21 |
| 2008/0073550 A1 | 3/2008 | Gupta et al. | |
| 2010/0181470 A1 | 7/2010 | Farley et al. | |
| 2013/0256566 A1* | 10/2013 | Kariya | H01L 21/67213 |
| | | | 250/492.21 |
| 2015/0001418 A1* | 1/2015 | Ido | H01J 37/3171 |
| | | | 250/397 |
| 2015/0311037 A1* | 10/2015 | Kabasawa | H01J 37/3171 |
| | | | 250/397 |
| 2015/0364297 A1 | 12/2015 | Tsukihara et al. | |
| 2017/0098458 A1* | 4/2017 | Kamiya | G11B 5/3163 |
| 2017/0271127 A1* | 9/2017 | Ishibashi | H01J 37/244 |
| 2019/0244782 A1* | 8/2019 | Kawatsu | H01J 37/3171 |
| 2019/0244785 A1* | 8/2019 | Ido | H01J 37/023 |
| 2019/0295818 A1* | 9/2019 | Inda | H01J 37/244 |

FOREIGN PATENT DOCUMENTS

| | | |
|---|---|---|
| JP | 5203221 B2 | 6/2013 |
| JP | 5397623 B2 | 1/2014 |
| JP | 5676481 B2 | 2/2015 |
| JP | 2016-004614 A | 1/2016 |
| JP | 6150632 B2 | 6/2017 |
| JP | 2017-174505 A | 9/2017 |

* cited by examiner

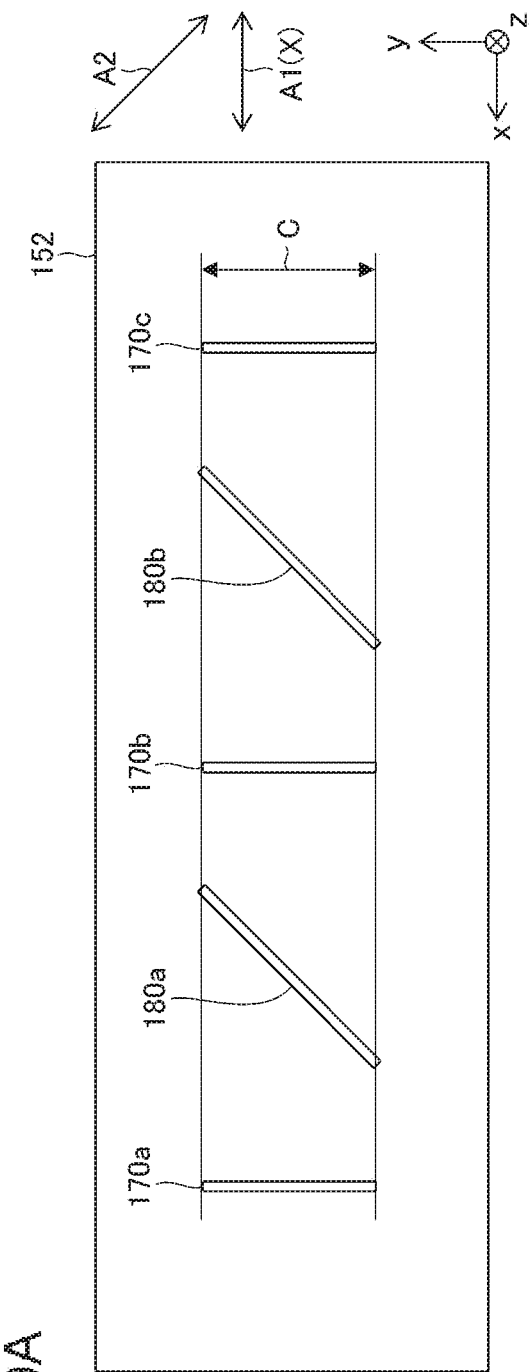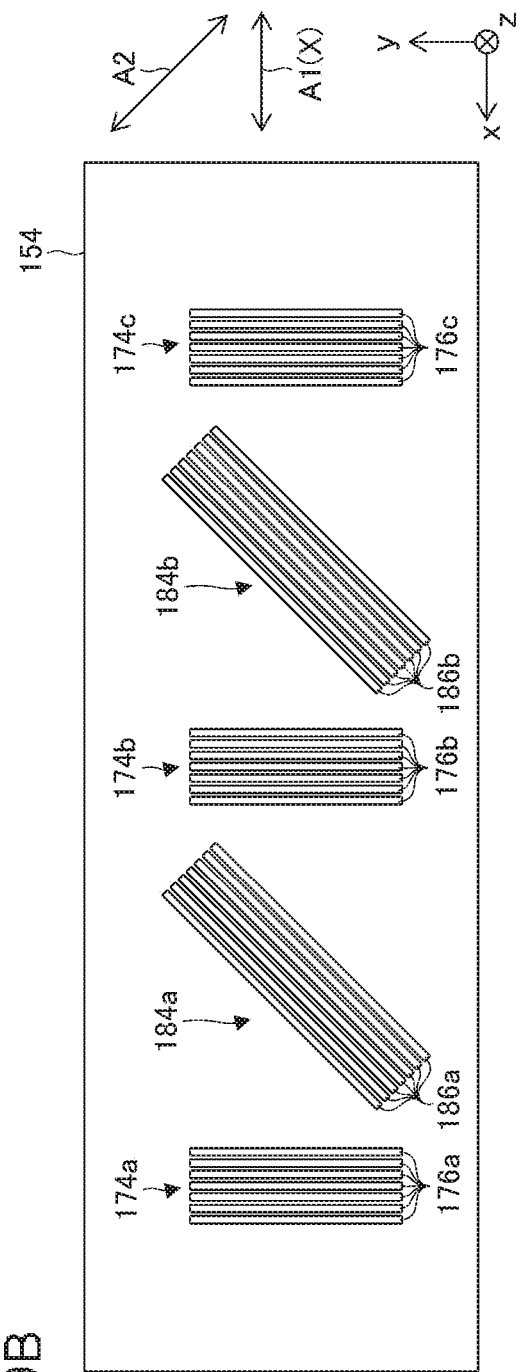

US 10,790,117 B2

ION IMPLANTATION APPARATUS AND MEASUREMENT DEVICE

RELATED APPLICATIONS

Priority is claimed to Japanese Patent Application No. 2018-057573, filed Mar. 26, 2018, the entire content of which is incorporated herein by reference.

BACKGROUND

Technical Field

Certain embodiments of the invention relate to an ion implantation apparatus and a measurement device.

Description of Related Art

In semiconductor manufacturing processes, a process for implanting ions into a semiconductor wafer (also referred to as an ion implantation process) is generally conducted for a change in semiconductor conductivity, a change in the crystal structure of a semiconductor, and the like. It is known that the manner of interaction between an ion beam and a wafer varies with the angle of the ion beam with which the wafer is irradiated and this variation affects ion implantation processing results. The angular distribution of the ion beam is measured before ion implantation. For example, the current value of the beam that has passed through a slit is measured at a plurality of electrodes lining up in the width direction of the slit, and then the angular distribution in the slit width direction can be obtained (see, for example, the related art).

SUMMARY

According to an embodiment of the invention, there is provided an ion implantation apparatus including a beamline device configured to transport an ion beam with which a wafer is irradiated, a first angle measuring instrument configured to measure angle information on the ion beam in a first direction perpendicular to a beam traveling direction, a second angle measuring instrument configured to measure angle information on the ion beam in a second direction perpendicular to the beam traveling direction and crossing the first direction, a relative movement mechanism configured to change relative positions of the first angle measuring instrument and the second angle measuring instrument with respect to the ion beam in a predetermined relative movement direction perpendicular to the beam traveling direction and not perpendicular to both the first direction and the second direction, and a control device configured to calculate angle information on the ion beam in a third direction perpendicular to both the beam traveling direction and the relative movement direction based on the angle information on the ion beam in the first direction measured by the first angle measuring instrument while changing the relative position of the first angle measuring instrument with respect to the ion beam and the angle information on the ion beam in the second direction measured by the second angle measuring instrument while changing the relative position of the second angle measuring instrument with respect to the ion beam.

According to another embodiment of the invention, there is provided a measurement device configured to measure angle information on an ion beam, including a first angle measuring instrument configured to measure angle information on the ion beam in a first direction perpendicular to a beam traveling direction, a second angle measuring instrument configured to measure angle information on the ion beam in a second direction perpendicular to the beam traveling direction and crossing the first direction, and a control unit configured to calculate angle information on the ion beam in a third direction perpendicular to both the beam traveling direction and a predetermined relative movement direction based on the angle information on the ion beam in the first direction measured by the first angle measuring instrument while changing a relative position of the first angle measuring instrument with respect to the ion beam in the predetermined relative movement direction and the angle information on the ion beam in the second direction measured by the second angle measuring instrument while changing a relative position of the second angle measuring instrument with respect to the ion beam in the predetermined relative movement direction, wherein the predetermined relative movement direction is perpendicular to the beam traveling direction and not perpendicular to both the first direction and the second direction.

BRIEF DESCRIPTION OF THE DRAWINGS

FIGS. 9A and 9B are plan views illustrating configurations of a mask plate and a charge detection unit.

DETAILED DESCRIPTION

Figure 1:
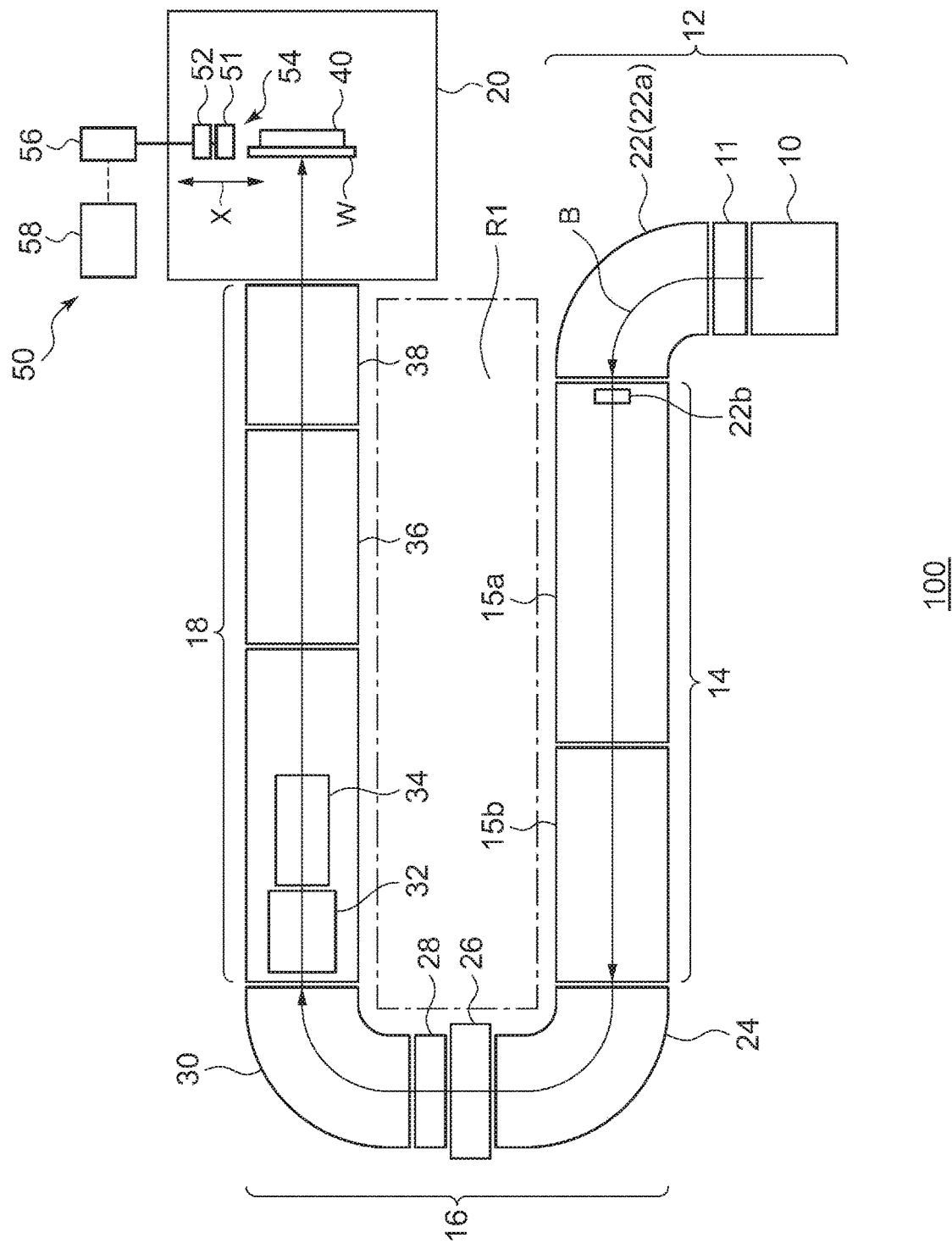
FIG. 1 is a top view schematically illustrating an ion implantation apparatus according to an embodiment.

In order to appropriately grasp ion beam angle information, it is preferable to obtain not only the angular distribution at a specific position within the beam cross section but also the angular distribution over the entire of the beam. However, the overall beam angular distribution measurement takes time as angle measurements need to be performed at a plurality of positions within the beam cross section while the slit is moved in a beam-crossing direction. In order to obtain two-dimensional angle information, for example, angle information measurement needs to be performed during a slit movement in each of horizontal and vertical directions, which takes more measurement time. For improvement of throughput in semiconductor manufacturing process, it is preferable that the angular distribution of the beam can be acquired within a shorter time.

It is desirable to provide a technique for quickly acquiring two-dimensional ion beam angle information.

It is to be noted that any combination of the above constituent elements and mutual substitutions of constituent elements and expressions of the embodiments of the invention among methods, apparatuses, systems, and so on are also effective as aspects of the embodiments of the invention.

With the present invention, two-dimensional ion beam angle information can be quickly acquired.

Hereinafter, modes for carrying out embodiments of the invention will be described in detail with reference to accompanying drawings. In the description of the drawings, the same elements are denoted by the same reference numerals, and duplicate description will be omitted as appropriate. In addition, the following configuration is an example, and does not limit the scope of the embodiments of the invention.

FIG. 1 is a top view schematically illustrating an ion implantation apparatus 100 according to an embodiment of the invention. The ion implantation apparatus 100 is a so-called high energy ion implantation apparatus. The high energy ion implantation apparatus is an ion implantation apparatus that has a radio frequency linear acceleration-type ion acceleration unit and a beamline for high energy ion transport, accelerates ions generated at an ion source 10, transports a resultant ion beam B along the beamline to an object to be processed (such as a substrate or a wafer W), and implants the ions into the object to be processed.

The high energy ion implantation apparatus 100 is provided with an ion beam generation unit 12 generating ions and performing mass analysis, a high energy multistage linear acceleration unit 14 accelerating an ion beam into a high energy ion beam, a beam deflection unit 16 performing energy analysis, trajectory correction, and energy dispersion control of the high energy ion beam, a beam transport line unit 18 transporting the analyzed high energy ion beam to the wafer W, and a substrate transporting/processing unit 20 implanting the transported high energy ion beam into a semiconductor wafer.

The ion beam generation unit 12 has the ion source 10, an extraction electrode 11, and a mass analyzer 22. In the ion beam generation unit 12, a beam is extracted from the ion source 10 through the extraction electrode 11 and accelerated simultaneously, and the extracted and accelerated beam is mass-analyzed by the mass analyzer 22. The mass analyzer 22 has a mass analyzing magnet 22a and a mass analyzing slit 22b. Although the mass analyzing slit 22b may be disposed immediately downstream of the mass analyzing magnet 22a, the mass analyzing slit 22b in the example is disposed in the entrance portion of the high energy multistage linear acceleration unit 14, which is the following configuration. As a result of the mass analysis by the mass analyzer 22, only the ion species that is necessary for implantation is selected, and the ion beam of the selected ion species is led to the following high energy multistage linear acceleration unit 14.

The high energy multistage linear acceleration unit 14 is provided with a plurality of linear accelerators, that is, accelerating gaps which are disposed upstream and downstream of one or more radio frequency resonators and accelerate the ion beam. The high energy multistage linear acceleration unit 14 is capable of accelerating ions by the action of a radio frequency (RF) electric field. The high energy multistage linear acceleration unit 14 is provided with a first linear acceleration unit 15a that is provided with a standard multistage of radio frequency resonators for high energy ion implantation. In addition, the high energy multistage linear acceleration unit 14 may be provided with a second linear acceleration unit 15b that is provided with an additional multistage of radio frequency resonators for ultra-high energy ion implantation. The direction of the ion beam further accelerated by the high energy multistage linear acceleration unit 14 is changed by the beam deflection unit 16.

The high energy ion beam exiting from the radio frequency-type high energy multistage linear acceleration unit 14 accelerating an ion beam to high energy has a certain range of energy distribution. Accordingly, for beam scanning and beam parallelization to be performed on the high energy ion beam in downstream of the high energy multistage linear acceleration unit 14 and for beam irradiation to a wafer, high accuracy energy analysis, trajectory correction, and beam convergence and divergence adjustment need to be performed in advance.

The beam deflection unit 16 performs energy analysis, trajectory correction, and energy dispersion control of the high energy ion beam. The beam deflection unit 16 is provided with at least two high accuracy deflecting electromagnets, at least one energy width limiting slit, at least one energy analysis slit, and at least one horizontally focusing instrument. The deflecting electromagnets are configured to perform energy analysis, precise ion implantation angle correction, and energy dispersion suppression of the high energy ion beam.

The beam deflection unit 16 has an energy analyzing electromagnet 24, a horizontally focusing quadrupole lens 26 suppressing energy dispersion, an energy analysis slit 28, and a deflecting electromagnet 30 providing beam steering (trajectory correction). The energy analyzing electromagnet 24 is sometimes called an energy filter electromagnet (EFM). The high energy ion beam heads towards the wafer W after the direction of the high energy ion beam is changed by the beam deflection unit 16.

The beam transport line unit 18 is a beamline device transporting the ion beam B exiting from the beam deflection unit 16, and has a beam shaper 32 configured with focusing/defocusing lens groups, a beam scanner 34, a beam parallelizing unit 36, and a final energy filter 38 (including a final energy separating slit). The length of the beam transport line unit 18 is designed in accordance with the total length of the ion beam generation unit 12 and the high energy multistage linear acceleration unit 14. The implanter 100 forms a layout that has a U shape as a whole by connecting the beam transport line unit 18 and the high energy multistage linear acceleration unit 14 with to the beam deflection unit 16.

The substrate transporting/processing unit 20 is provided at the downstream terminal end of the beam transport line unit 18. The substrate transporting/processing unit 20 is provided with a platen drive device 40 holding the wafer W during ion implantation and moving the wafer W in a direction perpendicular to the beam scanning direction. In addition, the substrate transporting/processing unit 20 is provided with a measurement device 50 for measuring the beam current and the angular distribution of the ion beam B. The measurement device 50 is provided with a beam measurement mechanism 54 including a first angle measuring instrument 51 and a second angle measuring instrument 52, a moving mechanism 56, and a control unit 58. The beam measurement mechanism 54 is configured to be, for example, movable in the direction that is indicated by an arrow X and insertable into an "implantation position" where the wafer W is disposed during ion implantation and measures the angular distribution of the ion beam at the implantation position. Details of the measurement device 50 will be described later.

The beamline portion of the ion implantation apparatus 100 is configured as a horizontal and U-shaped folded beamline that has two long linear portions facing each other. A plurality of units accelerating the ion beam B generated by the ion beam generation unit 12 constitute the upstream long linear portion. A plurality of units adjusting the ion beam B changed in direction with respect to the upstream long linear portion and implanting the ion beam B into the wafer W constitute the downstream long linear portion. The two long linear portions are configured to have substantially the same length. Provided between the two long linear portions is a workspace R1, which has a sufficient area for maintenance work.

Figure 2:
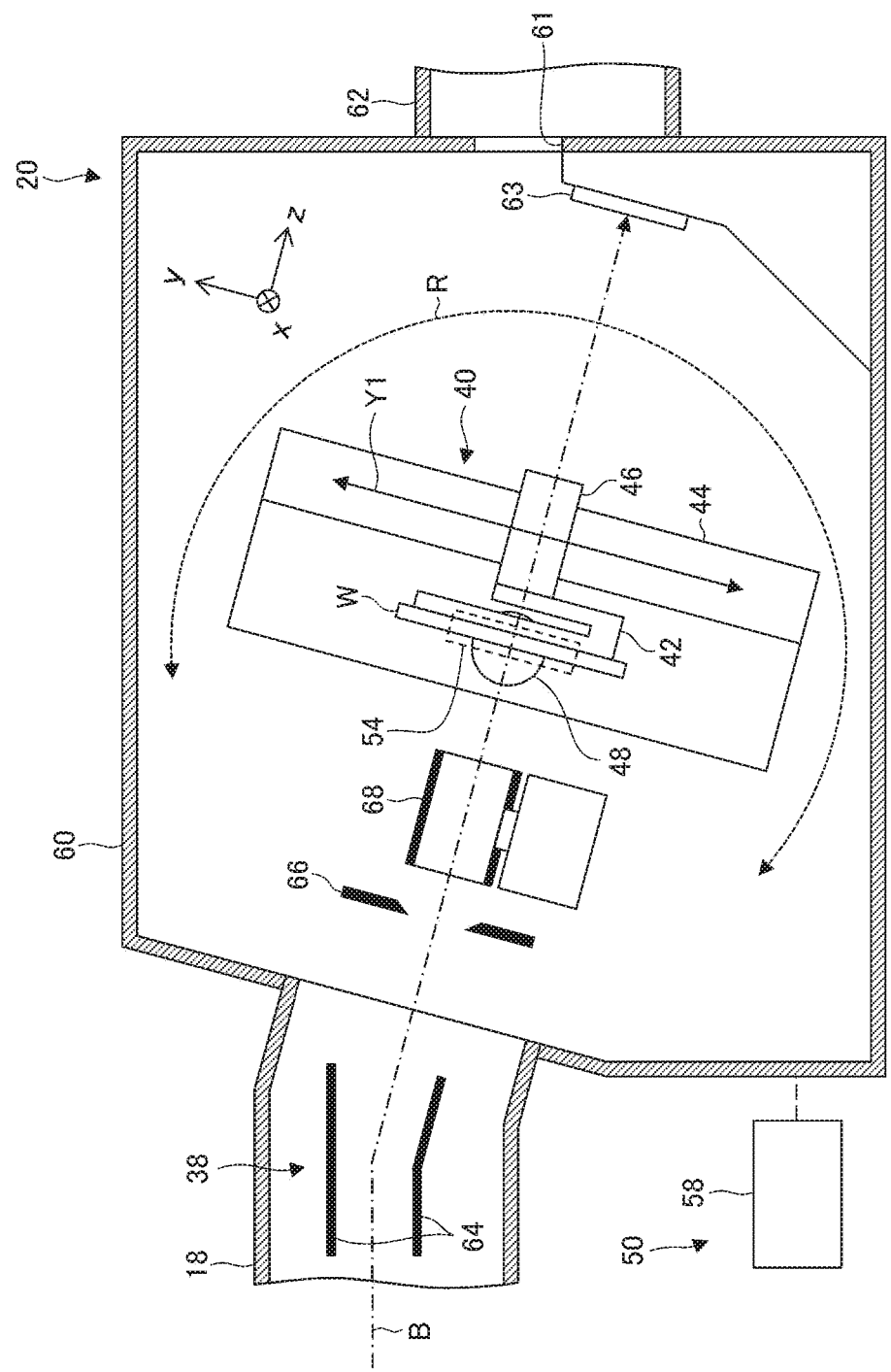
FIG. 2 is a side view illustrating a configuration of a substrate transporting/processing unit in detail.

FIG. 2 is a side view illustrating a configuration of the substrate transporting/processing unit 20 in detail and illustrating a configuration on the downstream side of the final energy filter 38. The ion beam B is deflected downwards by angular energy filter (AEF) electrodes 64 of the final energy filter 38, and the ion beam B is incident into the substrate transporting/processing unit 20. The substrate transporting/processing unit 20 includes an implantation process chamber 60 in which an ion implantation process is executed and a substrate transport unit 62 provided with a transport mechanism for transporting the wafer W. The implantation process chamber 60 and the substrate transport unit 62 are connected to each other via a substrate transport port 61.

The implantation process chamber 60 is provided with the platen drive device 40 holding the at least one wafer W. The platen drive device 40 includes a wafer holding device 42, a reciprocating mechanism 44, a twist angle adjustment mechanism 46, and a tilt angle adjustment mechanism 48. The wafer holding device 42 includes, for example, an electrostatic chuck for holding the wafer W. By causing the wafer holding device 42 to reciprocate in a reciprocating direction (the y direction) perpendicular to the beam scanning direction (the x direction), the reciprocating mechanism 44 causes the wafer W held by the wafer holding device 42 to reciprocate in the y direction. The arrow Y1 in FIG. 2 exemplifies the reciprocating motion of the wafer W.

The twist angle adjustment mechanism 46 is a mechanism adjusting the rotational angle of the wafer W. By rotating the wafer W about a normal line on a wafer processing surface, the twist angle adjustment mechanism 46 adjusts the twist angle between a reference position and an alignment mark provided in an outer peripheral portion of the wafer. Here, the alignment mark of the wafer means a notch or an orientation flat provided in the outer peripheral portion of the wafer and a mark serving as a reference of an angular position in a crystal axial direction of the wafer or a circumferential direction of the wafer. The twist angle adjustment mechanism 46 is provided between the wafer holding device 42 and the reciprocating mechanism 44 and is caused to reciprocate with the wafer holding device 42.

The tilt angle adjustment mechanism 48 is a mechanism adjusting the tilt of the wafer W and adjusts the tilt angle between the traveling direction (the z direction) of the ion beam B directed to the wafer processing surface and the normal line on the wafer processing surface. In the present embodiment, an angle having an axis in the x direction as the central axis of rotation among the inclination angles of the wafer W is adjusted as the tilt angle. The tilt angle adjustment mechanism 48 is provided between the reciprocating mechanism 44 and the inner wall of the implantation process chamber 60. The tilt angle adjustment mechanism 48 is configured to adjust the tilt angle of the wafer W by rotating the entire platen drive device 40 including the reciprocating mechanism 44 in an R direction.

In the implantation process chamber 60, an energy slit 66, a plasma shower device 68, and a beam damper 63 are provided from the upstream side toward the downstream side along the trajectory of the ion beam B. The implantation process chamber 60 is provided with the beam measurement mechanism 54 that can be inserted into the implantation position where the wafer W is disposed during ion implantation. In the drawing, the position of the beam measurement mechanism 54 that is inserted in the implantation position is indicated by a dashed line.

The energy slit 66 is provided on the downstream side of the AEF electrodes 64 and performs energy analysis, with the AEF electrodes 64, on the ion beam B incident into the wafer W. The energy slit 66 is an energy defining slit (EDS), and a slit that is horizontally elongated in the beam scanning direction (the x direction) constitutes the energy slit 66. The energy slit 66 allows the ion beam B having a desired energy value or energy range to pass toward the wafer W and shields other ion beams.

The plasma shower device 68 is positioned on the downstream side of the energy slit 66. The plasma shower device 68 supplies low energy electrons to the ion beam and the wafer processing surface in accordance with the beam current of the ion beam B and suppresses the charge-up due to the positive charge on the wafer processing surface that results from ion implantation. The plasma shower device 68 includes, for example, a shower tube through which the ion beam B passes and a plasma generating device supplying electrons into the shower tube.

The beam damper 63 is provided on the most downstream side of the beam trajectory. For example, the beam damper 63 is attached below the substrate transport port 61. Accordingly, in a case where the wafer W or the beam measurement mechanism 54 is not present on the beam trajectory, the ion beam B is incident into the beam damper 63. The beam damper 63 may be provided with a beam measurement device different from the beam measurement mechanism 54 described above.

The beam measurement mechanism 54 measures the beam current of the ion beam B and the angle information on the ion beam B on the surface of the wafer W (wafer processing surface). The beam measurement mechanism 54 is movable, is retracted from the implantation position during ion implantation, and is inserted into the implantation position when the wafer W is not at the implantation position. The beam measurement mechanism 54 is configured to be, for example, movable in the x direction by the moving mechanism 56 illustrated in FIG. 1.

Figure 3:
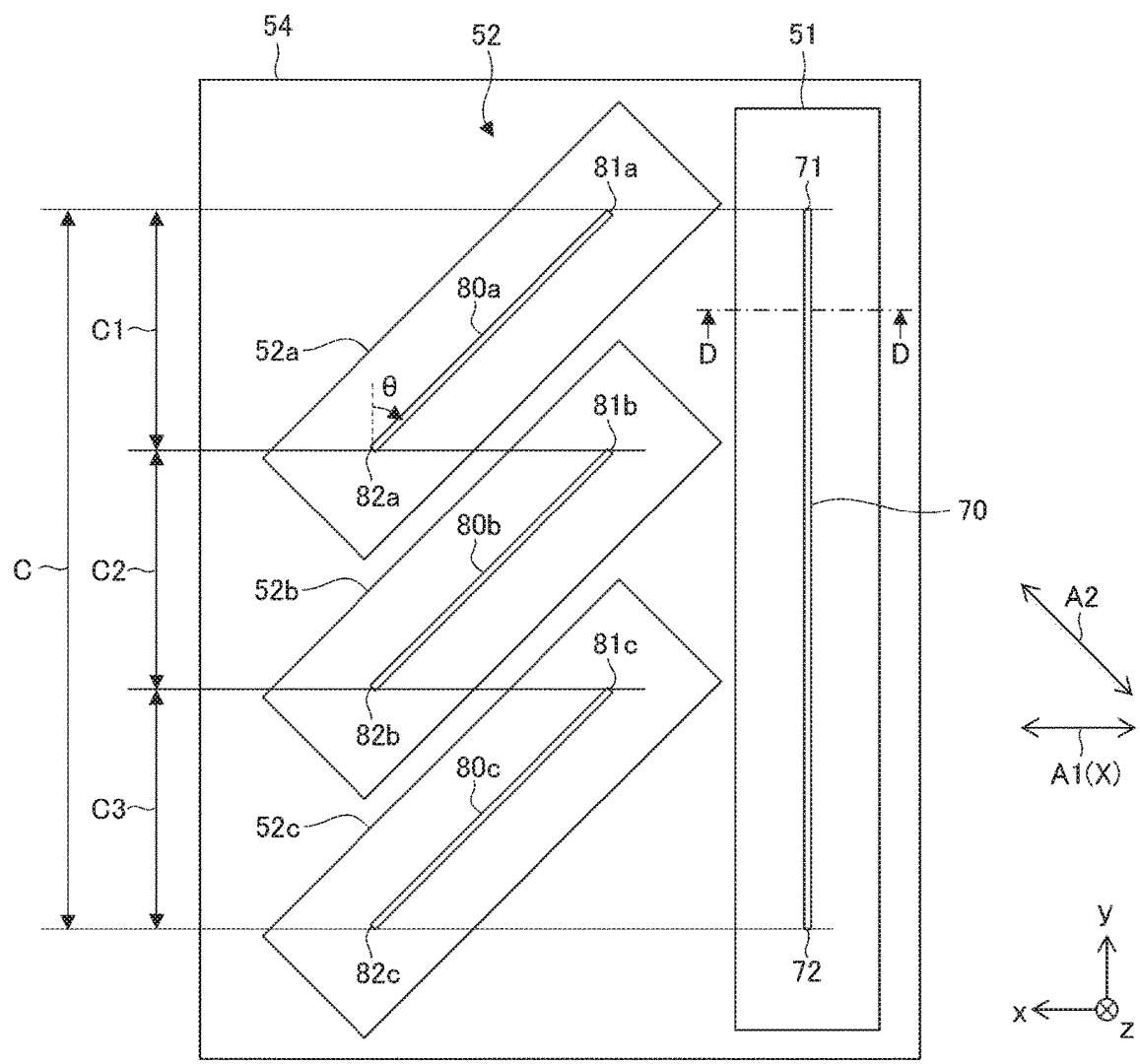
FIG. 3 is a plan view schematically illustrating a configuration of a beam measurement mechanism.

FIG. 3 is a plan view schematically illustrating a configuration of the beam measurement mechanism 54. Illustrated in FIG. 3 is the disposition configuration of the first angle measuring instrument 51 and the second angle measuring instrument 52 as viewed in the beam traveling direction (the z direction). The first angle measuring instrument 51 is configured to measure angle information in a first direction (such as the direction that is indicated by an arrow A1), and the second angle measuring instrument 52 is configured to measure angle information in a second direction (such as the direction that is indicated by an arrow A2). Here, the "first direction" is one of directions perpendicular to the beam traveling direction (the z direction). In the illustrated example, the "first direction" is the scanning direction of the ion beam B (the x direction). The "second direction" is one of directions perpendicular to the beam traveling direction and crossing the first direction. In the illustrated example, the "second direction" diagonally crosses the first direction at an angle θ. The "second direction" is set to be different from a third direction (such as the y direction) perpendicular to the beam traveling direction and a predetermined relative movement direction. Here, the predetermined relative movement direction is a direction in which the relative position of the beam measurement mechanism 54 changes with respect to the ion beam B, and details of the predetermined relative movement direction will be described later. In the illustrated example, the angle θ between the first direction and the second direction is 45°.

Figure 4:
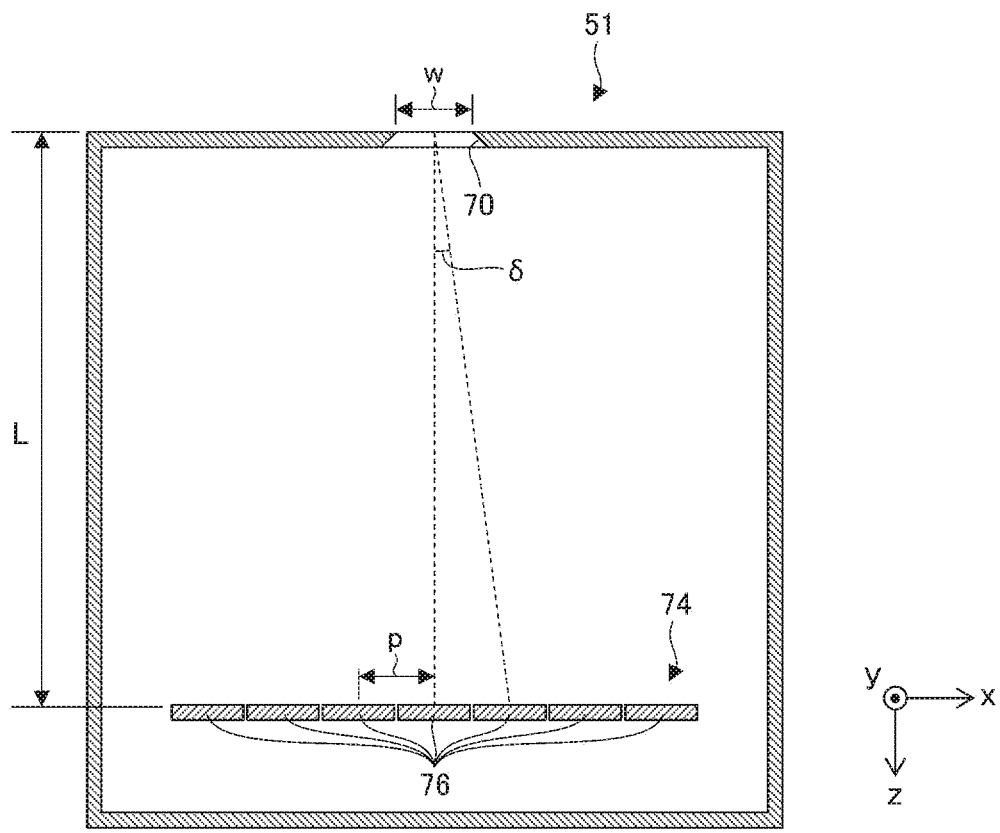
FIG. 4 is a cross-sectional view schematically illustrating an internal configuration of a first angle measuring instrument.

The first angle measuring instrument 51 has a first slit 70 having a slit width direction coinciding with the first direction and a first charge detection unit 74 for measuring the angular distribution in the first direction of a beam component passing through the first slit 70 (see FIG. 4). The first slit 70 continuously extends in the y direction from a first end portion 71 to a second end portion 72 and measures the ion beam B incident into a measurement range C covering from the first end portion 71 to the second end portion 72. The y-direction length of the measurement range C is, for example, set to exceed the y-direction beam size of the ion beam B and set such that the entire y-direction beam width of the ion beam B is a measurement target.

FIG. 4 is a cross-sectional view schematically illustrating the internal configuration of the first angle measuring instrument 51 and corresponds to the cross section at the D-D line of FIG. 3. The first angle measuring instrument 51 has the first charge detection unit 74 provided at a position away from the first slit 70 in the beam traveling direction (the z direction). The first charge detection unit 74 includes a plurality of first electrodes 76 disposed side by side in the slit width direction of the first slit 70 (that is, the first direction or the x direction). For example, the plurality of first electrodes 76 are configured such that a pitch p of the adjacent electrodes is equal to a slit width w of the first slit 70. The first angle measuring instrument 51 measures an angle δ of the incident ion beam B based on the beam current that is detected by each of the plurality of first electrodes 76. The angular resolution of the first angle measuring instrument 51 is configured to be, for example, 1° or less. Preferably, the angular resolution is configured to be 0.5° or less. More preferably, the angular resolution is configured to be approximately 0.1°.

Returning to FIG. 3, a plurality of angle measurement units 52a, 52b, and 52c constitute the second angle measuring instrument 52. The plurality of angle measurement units 52a to 52c have second slits 80a, 80b, and 80c (collectively referred to as second slits 80), respectively. The slit width directions of the second slits 80 coincide with the second direction. The plurality of angle measurement units 52a to 52c also have second charge detection units (not illustrated) for measuring the angular distributions in the second direction of beam components passing through the second slits 80a to 80c, respectively. Each of the plurality of angle measurement units 52a to 52c is similar in configuration to the first angle measuring instrument 51 illustrated in FIG. 4. The second charge detection unit of each of the angle measurement units 52a to 52c is provided at a position away from the second slits 80 in the beam traveling direction (the z direction) and includes a plurality of second electrodes disposed side by side in the slit width direction of the second slits 80 (that is, the second direction). The angular resolution of each of the angle measurement units 52a to 52c is configured to be, for example, 1° or less. Preferably, the angular resolution is configured to be 0.5° or less. More preferably, the angular resolution is configured to be approximately 0.1°.

The plurality of angle measurement units 52a to 52c are disposed side by side in the third direction (such as the y direction). The plurality of angle measurement units 52a to 52c respectively have measurement ranges C1 to C3 disposed so as to continuously line up in the y direction, and the plurality of angle measurement units 52a to 52c are disposed such that the measurement ranges C1 to C3 do not overlap each other in the y direction. As a result, the second angle measuring instrument 52 realizes angle measurement equivalent to that of an angle measuring instrument having a single slit continuous in the y direction over the entire measurement range C. By using the second angle measuring instrument 52 having the second slits 80 extending in an oblique direction and divided into a plurality of parts, the x-direction size that is occupied by the second angle measuring instrument 52 can be smaller than in a case where a single and continuously extending second slit is provided and the beam measurement mechanism 54 can be reduced in size.

In the illustrated configuration, the second angle measuring instrument 52 is divided into the three angle measurement units 52a to 52c. The second angle measuring instrument 52 includes the upper angle measurement unit 52a, the middle angle measurement unit 52b, and the lower angle measurement unit 52c sequentially arranged in the y direction. A first end portion 81a of the second slit 80a of the upper angle measurement unit 52a coincides in y-direction position with the first end portion 71 of the first slit 70. A second end portion 82a of the second slit 80a of the upper angle measurement unit 52a coincides in y-direction position with a first end portion 81b of the second slit 80b of the middle angle measurement unit 52b. Likewise, a second end portion 82b of the second slit 80b of the middle angle measurement unit 52b coincides in y-direction position with a first end portion 81c of the second slit 80c of the lower angle measurement unit 52c. A second end portion 82c of the second slit 80c of the lower angle measurement unit 52c coincides in y-direction position with the second end portion 72 of the first slit 70. Based on such disposition relationship, the measurement ranges C of the first angle measuring instrument 51 and the second angle measuring instrument 52 are capable of coinciding with each other and the measurement ranges C1 to C3 of the plurality of angle measurement units 52a to 52c are capable of being continuous without overlapping in the y direction. Although the x-direction positions of the second slits 80a to 80c of the plurality of angle measurement units 52a to 52c of the second angle measuring instrument 52 coincide with each other in FIG. 3, the positions of the second slits 80a to 80c may deviate from each other in the x direction in another embodiment.

The second angle measuring instrument 52 does not necessarily have to be divided into three. The second angle measuring instrument 52 may be divided into two or four or more as well (for example, FIG. 6 to be described later). In addition, the second angle measuring instrument 52 may not be divided, and the second angle measuring instrument 52 may be used that has the single second slits 80 which extends continuously over the entire measurement range C (for example, FIG. 7 to be described later). Further, a plurality of angle measurement units divided in the y direction may constitute the first angle measuring instrument 51.

The beam measurement mechanism 54 measures the angle information of the beam while changing the relative position of the beam measurement mechanism 54 with respect to the ion beam B in the predetermined relative movement direction. As a result, the beam measurement mechanism 54 measures the ion beam B over the entire range in the predetermined relative movement direction. The relative movement direction of the beam measurement mechanism 54 is a direction not perpendicular to both the first direction and the second direction described above. For example, the relative movement direction of the beam measurement mechanism 54 coincides with the above-described first direction (such as the x direction). Accordingly, it can be said that the relative movement direction of the beam measurement mechanism 54 is a direction not coinciding with the directions in which the first slit 70 and the second slits 80 extend.

The relative movement of the beam measurement mechanism 54 with respect to the ion beam B can be realized by a plurality of methods. For example, the beam measurement mechanism 54 may be moved in the predetermined relative movement direction with the ion beam B stationary. In this case, the moving mechanism 56 in FIG. 1 may be used as a relative movement mechanism and the position of the beam measurement mechanism 54 may be moved in the first direction. Alternatively, the ion beam B may be deflected in the predetermined relative movement direction with the beam measurement mechanism 54 stationary. In this case, a beam deflection device such as the beam scanner 34 in FIG. 1 may be used as a relative movement mechanism for scanning with the ion beam B in the first direction. Alternatively, the relative movement of the beam measurement mechanism 54 with respect to the ion beam B may be realized by moving the beam measurement mechanism 54 in the x direction while scanning with the ion beam B in the x direction.

The first angle measuring instrument 51 measures the angular distribution in the first direction of the ion beam B while relatively moving in the first direction (such as the x direction) with respect to the ion beam B. The first angle measuring instrument 51 measures the first-direction angular distribution over the entire beam widths of the ion beam B in both the x direction and the y direction by relatively moving over a range exceeding the first-direction beam width of the ion beam B. Likewise, the second angle measuring instrument 52 measures the angular distribution in the second direction of the ion beam B while relatively moving in the first direction (such as the x direction) with respect to the ion beam B. The second angle measuring instrument 52 measures the second-direction angular distribution over the entire beam widths of the ion beam B in both the x direction and the y direction by relatively moving over a range exceeding the distance that is obtained by adding the x-direction range of the second slits 80 to the first-direction beam width of the ion beam B.

Based on the first-direction angle information measured by the first angle measuring instrument 51 and the second-direction angle information measured by the second angle measuring instrument 52, the control unit 58 calculates angle information in the third direction (such as the y direction) perpendicular to both the beam traveling direction and the relative movement direction. For example, the control unit 58 calculates the angular distribution in the third direction of the ion beam B by using the first-direction angular distribution and the second-direction angular distribution of the ion beam B. The control unit 58 may calculate the two-dimensional angular distribution of the ion beam B. For example, the control unit 58 may calculate two-dimensional angular distributions in the x direction and the y direction. How the control unit 58 calculates the angular distribution will be described below.

Figure 5:
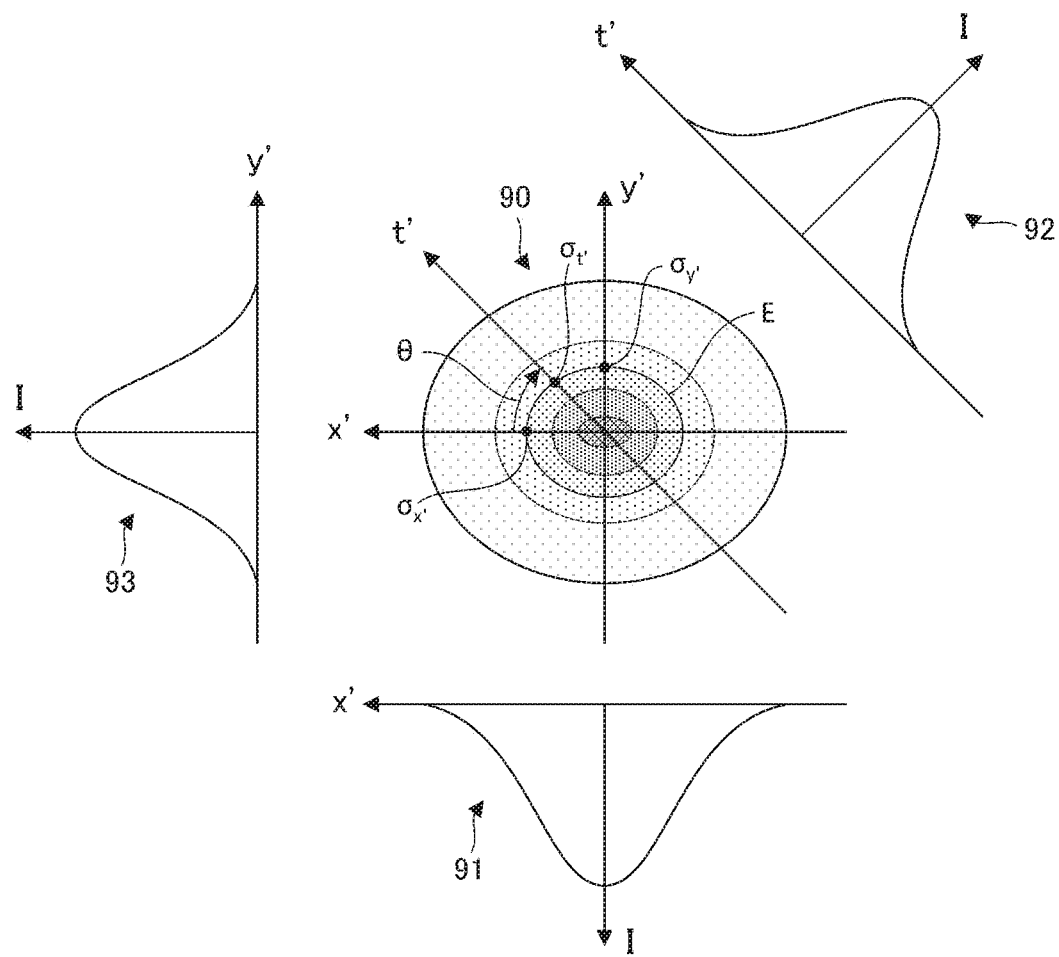
FIG. 5 is a diagram schematically illustrating a two-dimensional angular distribution of an ion beam and one-dimensional angular distributions measured or calculated with respect to different directions.

FIG. 5 is a diagram schematically illustrating a two-dimensional angular distribution 90 of the ion beam B and measured or calculated one-dimensional angular distributions 91, 92, and 93. As schematically illustrated in the middle of FIG. 5, the ion beam B may have the two-dimensional angular distribution 90 that spreads in the x and y directions. In FIG. 5, x' represents an x-direction angular component and y' represents a y-direction angular component. Typically, the two-dimensional angular distribution 90 of the ion beam B is a two-dimensional normal distribution (Gaussian distribution), and the distribution shape of the two-dimensional angular distribution 90 can be specified by the magnitudes of standard deviations a in the x direction and the y direction. The magnitudes of standard deviations $\sigma x'$ and $\sigma y'$ in the x and y directions correspond to the x-direction and y-direction axial lengths of a circular or elliptical contour of the two-dimensional angular distribution 90, respectively. For example, a contour E corresponding to the standard deviations of the two-dimensional angular distribution 90 can be expressed as $(x'/\sigma x')^2+(y'/\sigma y')^2=1$ on the two-dimensional coordinates of x' and y'. In the present embodiment, the two-dimensional angular distribution 90 is not directly measured but calculated from the first-direction (x-direction) angular distribution 91 and the second-direction (t-direction) angular distribution 92 by assuming a two-dimensional normal distribution.

The x-direction angular distribution 91 illustrated on the lower side of FIG. 5 is obtained by integrating the two-dimensional angular distribution 90 in the y direction and projecting on the x axis. The x-direction angular distribution 91 illustrated on the lower side of FIG. 5 corresponds to the first-direction angular distribution that can be measured by the first angle measuring instrument 51. The x-direction angular distribution 91 includes no y-direction angle information and includes the x-direction angle information of the two-dimensional angular distribution 90. Accordingly, it is possible to calculate the x-direction angle information (such as the x-direction standard deviation $\sigma x'$) in the two-dimensional angular distribution 90 based on the x-direction angular distribution 91. For example, it is possible to obtain a parameter relating to the x-direction angular distribution (such as the x-direction standard deviation $\sigma x'$) by fitting the measured value of the first-direction angular distribution measured by the first angle measuring instrument 51 to the normal distribution.

The angular distribution 92 illustrated on the upper right side of FIG. 5 is an angular distribution in the second direction (t direction) diagonally crossing the x direction at the angle θ. The angular distribution 92 results from projection of the two-dimensional angular distribution 90 on the t axis. The t-direction angular distribution 92 corresponds to the second-direction angular distribution that can be measured by the second angle measuring instrument 52. The t-direction angle information (such as a t-direction standard deviation $\sigma t'$) in the two-dimensional angular distribution 90 can be calculated from the t-direction angular distribution 92. For example, it is possible to obtain a parameter relating to the t-direction angular distribution (such as the t-direction standard deviation $\sigma t'$) by fitting the measured value of the second-direction angular distribution measured by the second angle measuring instrument 52 to the normal distribution.

It is possible to calculate or estimate the y-direction angle information by using the x-direction and t-direction angle information calculated as described above. The t-direction angle information corresponds to a vectorial combination of the x-direction and y-direction angle information. Accordingly, it is possible to obtain the y-direction angle information by excluding the x-direction angle information from the t-direction angle information. For example, the y-direction standard deviation σy' of the two-dimensional angular distribution 90 can be estimated based on the x-direction standard deviation σx' and the t-direction standard deviation σt'. For example, assuming that the x-direction and y-direction angular components are independent of each other, the following Equation (1) is satisfied regarding the x-direction standard deviation σx', the y-direction standard deviation σy', and the t-direction standard deviation σt'.

$$\sigma_{t'}^2 = \sigma_{x'}^2 \cos^2\theta + \sigma_{y'}^2 \sin^2\theta \quad (1)$$

It is possible to derive the above Equation (1) by, for example, interpreting the traveling directions of individual ions constituting the ion beam B as vectors and obtaining the t-direction angular component of the ions by vector operation on the assumption that the x-direction and y-direction angular components are independent of each other.

Accordingly, it is possible to obtain the unknown y-direction standard deviation σy' corresponding to the known standard deviations σx' and σt' by using the following Equation (2).

$$\sigma_{y'}^2 = \frac{\sigma_{t'}^2}{\sin^2\theta} - \frac{\sigma_{x'}^2}{\tan^2\theta} \quad (2)$$

By using Equation (2), it is possible to obtain the y-direction angular distribution 93 illustrated on the left side of FIG. 5. It is also possible to obtain the two-dimensional angular distribution 90 illustrated in the middle of FIG. 5.

Specific methods for calculating the y-direction angular distribution 93 or the two-dimensional angular distribution 90 from the x-direction and t-direction angular distributions 91 and 92 are not limited to the above, and other methods can be used as well. For example, the y-direction angular distribution 93 may be calculated by executing optimization calculation such that the distribution shapes of the x-direction, t-direction, and y-direction angular distributions 91 to 93 mutually match on the assumption that the x-direction and y-direction angular components are independent of each other. In this case, the y-direction angular distribution 93 may be calculated based on a condition different from the constraint condition that the two-dimensional angular distribution 90 is a two-dimensional normal distribution. For example, a vector function indicating the correlation between the t-direction angular distribution 92 and the y-direction angular distribution 93 may be obtained in advance and the y-direction angular distribution 93 may be calculated by using the vector function.

Although the angle θ between the x direction and the t direction is any angle in a case where the y-direction angular distribution is calculated based on the x-direction and t-direction angular distributions, the calculation accuracy of y-direction angular distribution can be enhanced as the angle θ increases (becomes closer to 90°). Specifically, the angle θ between the x direction and the t direction is preferably 30° or more and more preferably 45° or more or 60° or more. When the angle θ becomes too close to 90°, the second angle measuring instrument 52 becomes very long in the x direction and the ion beam B cannot be measured with ease over the entire y-direction beam width by means of the second angle measuring instrument 52. Accordingly, the angle θ is preferably 85° or less and more preferably 80° or less or 75° or less.

According to the present embodiment, it is possible to obtain the angle information in both the x direction and the y direction of the ion beam B simply by relatively moving the beam measurement mechanism 54 in one direction with respect to the ion beam B. In general, a slit needs to be relatively moved over the entire beam width in the width direction of the slit in a case where the entire angular distribution of the ion beam B having a predetermined beam width is measured. For two-dimensional angle information to be obtained, an x-direction angle measuring instrument should be relatively moved in the x direction and a y-direction angle measuring instrument should be relatively moved in the y direction, and thus relative movements are required in two directions perpendicular to each other. According to the present embodiment, however, both the x-direction and t-direction angle measuring instruments are capable of measuring the entire beam width simply by relatively moving in the x direction by the use of the angle measuring instrument in the t direction diagonally crossing the x direction. Further, it is possible to calculate the y-direction angle information, which is not directly measured, from the measured two-directional angle information. Therefore, according to the present embodiment, it is possible to shorten the measurement time required to acquire the angle information in the two directions perpendicular to each other and to acquire the two-dimensional angle information quickly. Further, a relative movement can be realized by means of the x-direction scanning with the ion beam B that is performed by the beam scanner 34, and thus the time required for the relative movement can be extremely short (for example, one second or less or down to approximately several milliseconds).

Figure 6:
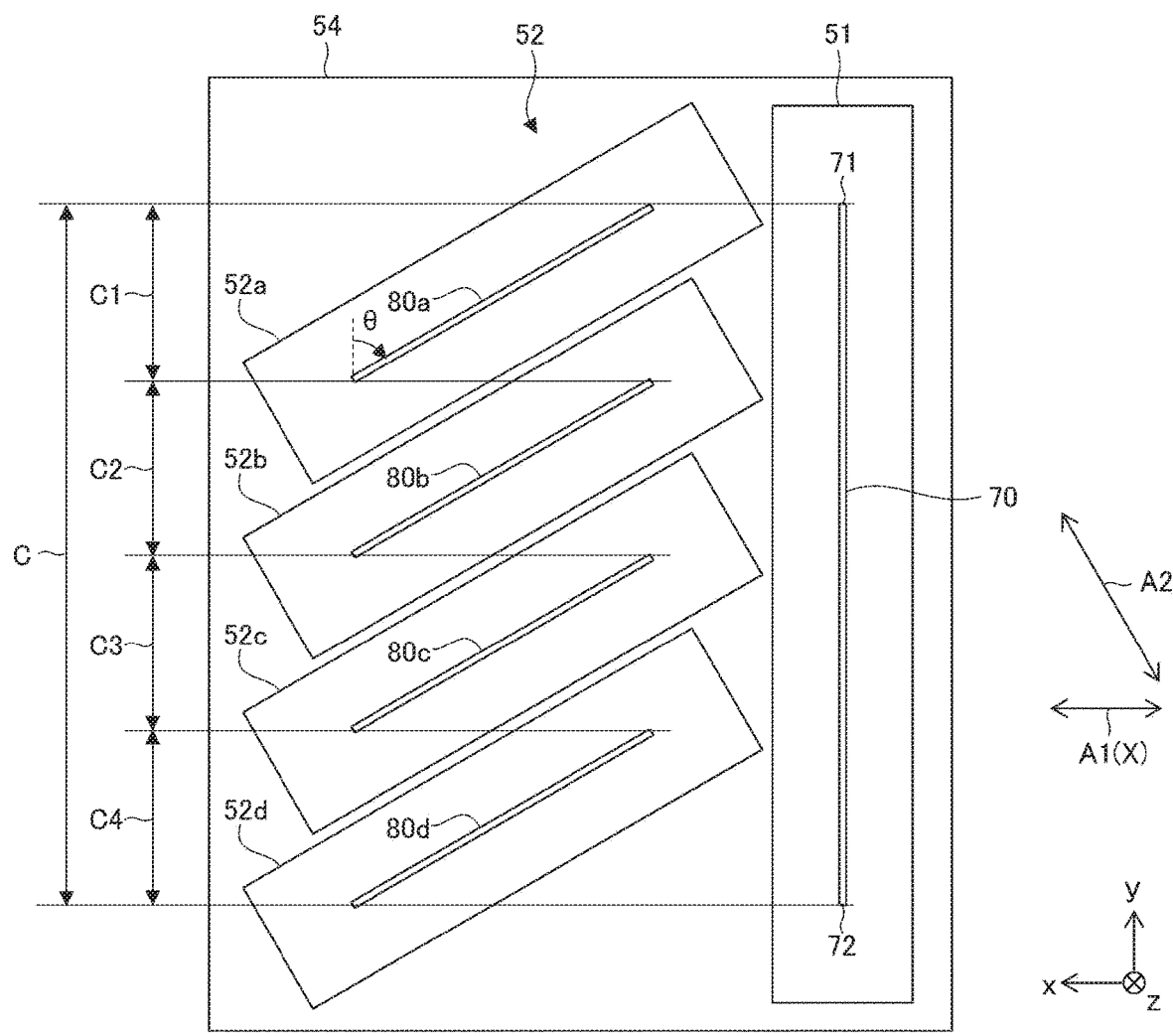
FIG. 6 is a plan view schematically illustrating a configuration of a beam measurement mechanism according to a modification example.

FIG. 6 is a plan view schematically illustrating a configuration of the beam measurement mechanism 54 according to a modification example. In this modification example, the angle θ between the first direction (an A1 direction) and the second direction (an A2 direction) is 60°, and the second angle measuring instrument 52 is divided into four angle measurement units 52a to 52d. The four angle measurement units 52a to 52d respectively have measurement ranges C1 to C4 disposed so as to continuously line up in the y direction, and the four angle measurement units 52a to 52d are disposed such that the measurement ranges C1 to C4 do not overlap each other in the y direction. According to the present modification example, the y-direction angle information can be calculated with higher accuracy than in the above embodiment.

Figure 7:
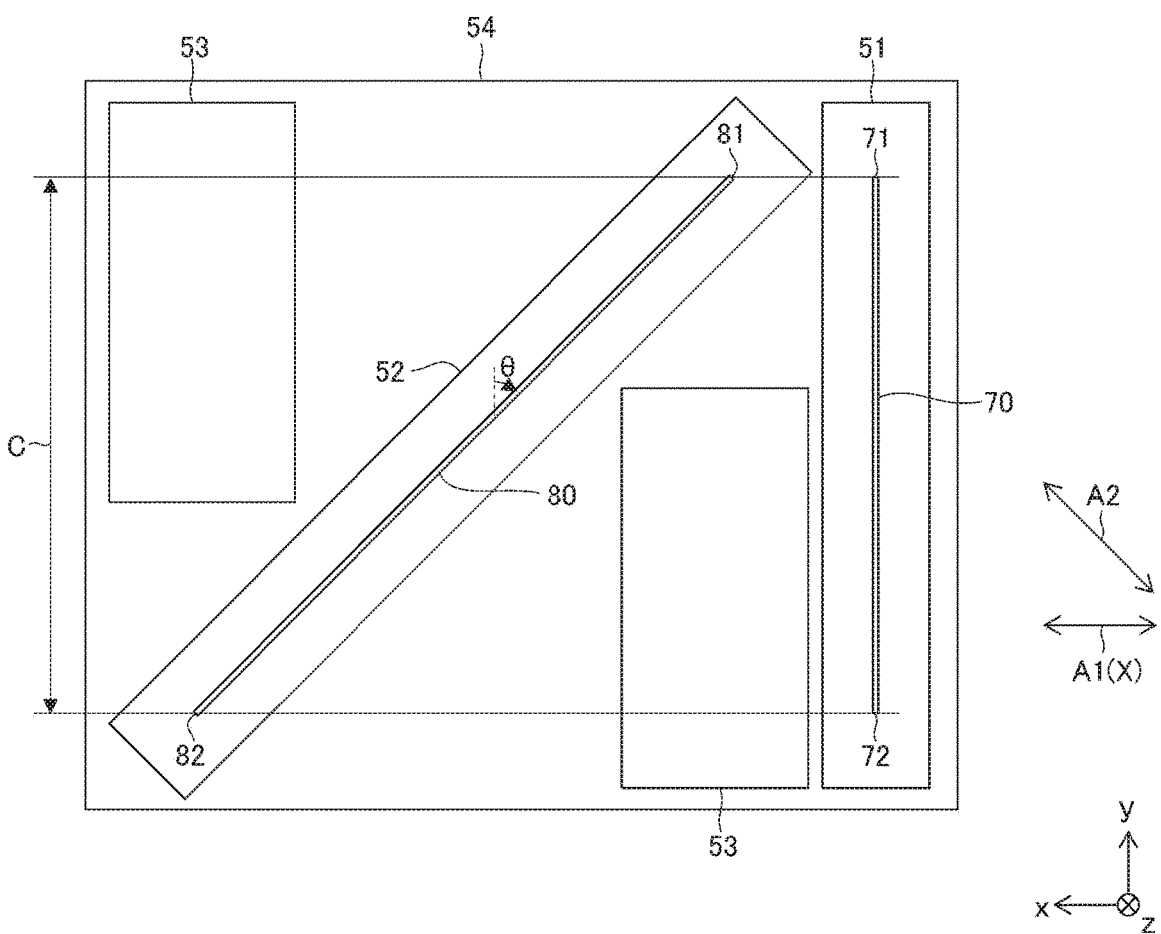
FIG. 7 is a plan view schematically illustrating a configuration of a beam measurement mechanism according to another modification example.

FIG. 7 is a plan view schematically illustrating a configuration of the beam measurement mechanism 54 according to another modification example. In the present modification example, the second angle measuring instrument 52 is not divided into a plurality of angle measurement units, and the second slit 80 of the second angle measuring instrument 52 is configured to continuously extend over the entire measurement range C of the first angle measuring instrument 51. More specifically, a first end portion 81 of the second slit 80 coincides in y-direction position with the first end portion 71 of the first slit 70, and a second end portion 82 of the second slit 80 coincides in y-direction position with the second end portion 72 of the first slit 70. In the present modification example, the same action and effect as in the above embodiment can be realized although the beam measurement mechanism 54 has a large size in the x direction.

In the modification example illustrated in FIG. 7, an additional beam measurement unit 53 may be disposed in a region where the first angle measuring instrument 51 and the second angle measuring instrument 52 are not provided. The additional beam measurement unit 53 may be, for example, a Faraday cup for measuring the beam current of the ion beam B or a profiler for measuring the beam profile of the ion beam B. By providing the beam measurement mechanism 54 with the additional beam measurement unit 53 for an application other than the angle measurement, another characteristics of the ion beam B can be measured simultaneously with the angle information measurement.

Figure 8:
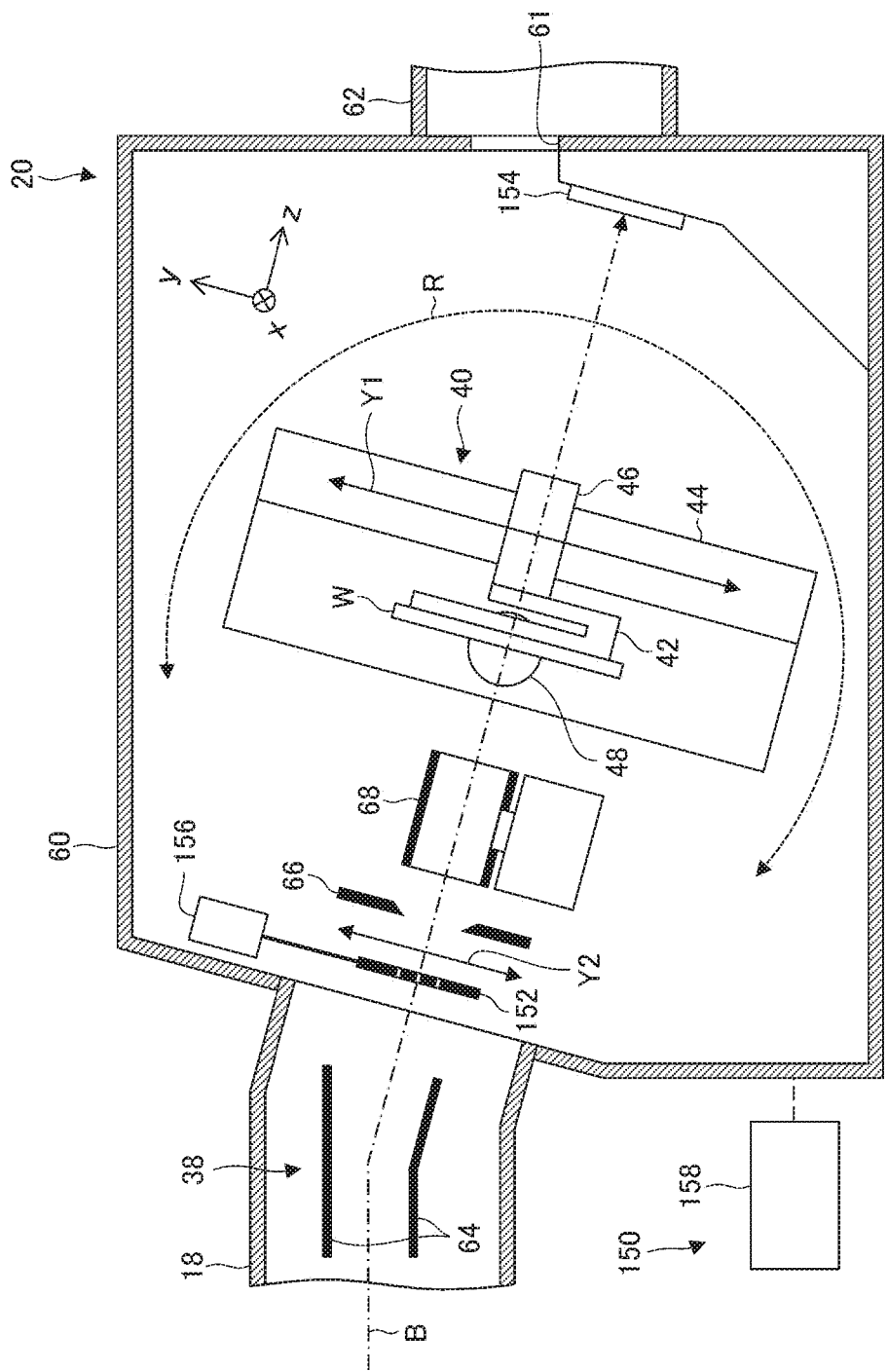
FIG. 8 is a side view illustrating a configuration of a substrate transporting/processing unit according to another embodiment in detail.

FIG. 8 is a side view illustrating a configuration of the substrate transporting/processing unit 20 according to another embodiment in detail. This embodiment is different from the above embodiment in that a mask plate 152 and a charge detection unit 154 are provided in place of the beam measurement mechanism 54 according to the above embodiment.

A measurement device 150 is provided with the mask plate 152, the charge detection unit 154, a moving mechanism 156, and a control unit 158. The mask plate 152 has a first slit having a slit width direction coinciding with the first direction and a second slit having a slit width direction coinciding with the second direction. The charge detection unit 154 has a first charge detection unit for measuring the first-direction angular distribution and a second charge detection unit for measuring the second-direction angular distribution. The first-direction angular distribution is measured by detecting a part of the beam that passes through the first slit of the mask plate 152 by the first charge detection unit of the charge detection unit 154. The second-direction angular distribution is measured by detecting a part of the beam that passes through the second slit of the mask plate 152 by the second charge detection unit of the charge detection unit 154. Accordingly, in the present embodiment, the combination of the mask plate 152 and the charge detection unit 154 functions as the first and second angle measuring instruments.

The mask plate 152 is disposed upstream of the implantation position of the wafer W. For example, the mask plate 152 is disposed upstream of the energy slit 66. The charge detection unit 154 is disposed downstream of the implantation position of the wafer W. For example, the charge detection unit 154 is provided at the beam damper position, which is in the most downstream side of the beam trajectory. The angular resolution of the measurement device 150 can be enhanced by increasing the distance from the mask plate 152 to the charge detection unit 154 in the beam traveling direction (the z direction).

The mask plate 152 is attached to the moving mechanism 156 and is configured to be movable in the y direction. The moving mechanism 156 is configured to move the mask plate 152 in the y direction. The mask plate 152 is inserted to the beam trajectory during measurement and is retracted from the beam trajectory during ion implantation. The moving mechanism 156 may be configured to move the mask plate 152 in the x direction and may realize a relative x-direction movement of the mask plate 152 with respect to the ion beam B during measurement.

FIGS. 9A and 9B are plan views illustrating configurations of the mask plate 152 and the charge detection unit 154. As illustrated in FIG. 9A, the mask plate 152 has first slits 170a, 170b, and 170c (collectively referred to as first slits 170) having a slit width direction coinciding with the first direction and second slits 180a and 180b (collectively referred to as second slits 180) having a slit width direction coinciding with the second direction. In the illustrated example, the first slits 170a to 170c are provided in three places (left, middle, and right) in the mask plate 152, and the second slits 180a and 180b are provided in two places (left and right) in the mask plate 152. The first slits 170 and the second slits 180 are provided so as to be continuous in the y direction over the predetermined measurement range C and are provided so as to coincide with each other in y-direction slit length.

As illustrated in FIG. 9B, the charge detection unit 154 has first charge detection units 174a, 174b, and 174c measuring the first-direction angular distribution and second charge detection units 184a and 184b measuring the second-direction angular distribution. The first charge detection units 174a to 174c respectively have a plurality of first electrodes 176a, 176b, 176c disposed side by side in the first direction. The first charge detection units 174a to 174c are provided at positions facing the corresponding first slits 170a to 170c in the beam traveling direction (the z direction), respectively. The second charge detection units 184a and 184b respectively have a plurality of second electrodes 186a and 186b disposed side by side in the second direction. The second charge detection units 184a and 184b are provided at positions facing the corresponding second slits 180a and 180b in the beam traveling direction (the z direction), respectively. The charge detection unit 154 may be configured as a profiler capable of moving in the x direction. For example, the charge detection unit 154 may be configured to move in the x direction in synchronization with the x-direction movement of the mask plate 152 in a case where a relative x-direction movement of the mask plate 152 is realized by the moving mechanism 156.

The control unit 158 calculates the angle information in the third direction of the ion beam B based on the angle information in the first direction of the beam measured by the first charge detection units 174a to 174c and the angle information in the second direction of the beam measured by the second charge detection units 184a and 184b. The control unit 158 may calculate the two-dimensional angular distribution of the ion beam B as well. This embodiment can also realize action and effect similar to those in the above embodiment.

The invention has been described above based on the embodiment. It is to be understood by those skilled in the art that the invention is not limited to the above embodiment, various design changes are possible, various modification examples are possible, and such modification examples are also within the scope of the embodiments of the invention.

According to the embodiment described above, the first direction is the x direction, the second direction is a direction diagonally crossing the x direction, the third direction is the y direction, and the relative movement direction is the x direction. Specific directions set in other embodiments are not limited thereto. The present embodiment is characterized in that angle information in any first and second directions perpendicular to the beam traveling direction and not perpendicular to the relative movement direction of the beam measurement mechanism is used for calculation of the angle information in a direction perpendicular to the beam traveling direction and the relative movement direction of the beam measurement mechanism.

Accordingly, the first direction may not be the x direction. For example, the first direction may be a direction diagonally crossing the x direction. In this case, the second direction may also be a direction diagonally crossing the x direction and different from the first direction. Also, the third direction may not be the y direction, and the third direction may be any direction perpendicular to the beam traveling direction and different from the first and second directions.

Figure 10:
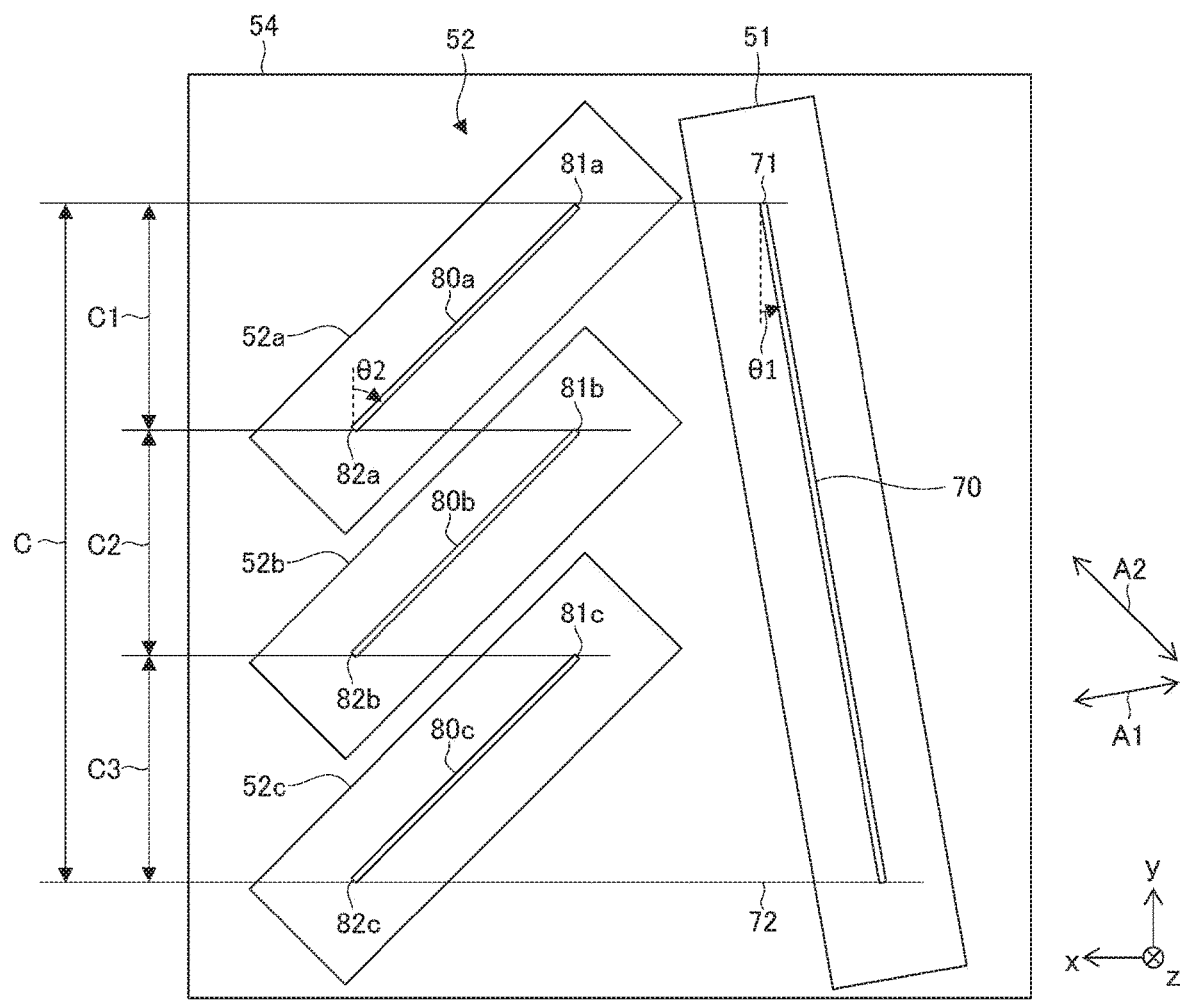
FIG. 10 is a plan view schematically illustrating a configuration of a beam measurement mechanism according to another modification example.

FIG. 10 is a plan view schematically illustrating a configuration of the beam measurement mechanism 54 according to another modification example. The present modification example is configured such that both the first direction A1 in which the first angle measuring instrument 51 measures angle information and the second direction A2 in which the second angle measuring instrument 52 measures angle information are oblique with respect to the x direction. In the illustrated example, an angle θ1 of the first direction A1 with respect to the x direction is 10° and an angle θ2 of the second direction A2 with respect to the x direction is 45°. By inclining both the first direction and the second direction at different angles with respect to the relative movement direction (the x direction) as illustrated in FIG. 10, it is possible to calculate angle information in each of the x direction and the y direction as in the embodiment described above. The value of the angle θ1 of the first direction with respect to the relative movement direction and the value of the angle θ2 of the second direction with respect to the relative movement direction may have any combination. For example, θ1 and θ2 can be selected from any of 10°, 15°, 25°, 30°, 45°, 60°, 75°, and 80°. In addition, the absolute values of the first-direction angle θ1 and the second-direction angle θ2 may be different from each other or the inclination directions (rotation directions) of the two may be opposite to each other with the absolute values equal to each other. For example, any set may be selected from (+30°, −30°), (+45°, −45°), and (+60°, −60°) as the value combination (θ1, θ2) of the first-direction angle θ1 and the second-direction angle θ2. Also, the angle between the first direction A1 and the second direction A2 may or may not be 90°.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
    a beamline device configured to transport an ion beam with which a wafer is irradiated;
    a first angle measuring instrument configured to measure angle information on the ion beam in a first direction perpendicular to a beam traveling direction, wherein the first angle measuring instrument includes a first slit in which the first direction coincides with a first width direction of the first slit and a first charge detection unit for measuring angular distribution in the first direction of a beam component passing through the first slit;
    a second angle measuring instrument configured to measure angle information on the ion beam in a second direction perpendicular to the beam traveling direction and crossing the first direction, wherein the second angle measuring instrument has a second slit in which the second direction coincides with a second width direction of the second slit and a second charge detection unit for measuring angular distribution in the second direction of a beam component passing through the second slit;
    a relative movement mechanism configured to change relative positions of the first angle measuring instrument and the second angle measuring instrument with respect to the ion beam in a predetermined relative movement direction perpendicular to the beam traveling direction and not perpendicular to both the first direction and the second direction, wherein the relative movement mechanism moves the first angle measuring instrument and the second angle measuring instrument in the relative movement direction.

2. The ion implantation apparatus according to claim 1, wherein the first angle measuring instrument and the second angle measuring instrument are integrated into one beam measurement mechanism.

3. The ion implantation apparatus according to claim 1, wherein the first angle measuring instrument and the second angle measuring instrument are configured to have the entire beam width of the ion beam in the third direction as a measurement target.

4. The ion implantation apparatus according to claim 3, wherein at least one of the first angle measuring instrument or the second angle measuring instrument has a single slit continuously extending over a measurement range in the third direction.

5. The ion implantation apparatus according to claim 1, wherein at least one of the first angle measuring instrument or the second angle measuring instrument is divided into a plurality of angle measurement units disposed side by side in the third direction, and
    wherein each of the plurality of angle measurement units has a slit and a charge detector for measuring an angular distribution of a beam component passing through the slit.

6. The ion implantation apparatus according to claim 5, wherein each of the plurality of angle measurement units is disposed such that two measurement ranges of two angle measurement units adjacent in the third direction do not overlap each other in the third direction.

7. The ion implantation apparatus according to claim 5, wherein the plurality of angle measurement units are disposed over the entire beam width of the ion beam in the third direction.

8. The ion implantation apparatus according to claim 1, wherein the first angle measuring instrument and the second angle measuring instrument are configured such that the first direction and the second direction cross each other diagonally.

9. The ion implantation apparatus according to claim 8, wherein an angle between the first direction and the second direction is 45 degrees or more and 85 degrees or less.

10. The ion implantation apparatus according to claim 1, wherein the relative movement direction is parallel to the first direction.

11. The ion implantation apparatus according to claim 1, further comprising:
    a controller configured to calculate angle information on the ion beam in a third direction perpendicular to both the beam traveling direction and the relative movement direction based on the angle information on the ion beam in the first direction measured by the first angle measuring instrument while changing the relative position of the first angle measuring instrument with respect to the ion beam and the angle information on the ion beam in the second direction measured by the second angle measuring instrument while changing the relative position of the second angle measuring instrument with respect to the ion beam.

12. An ion implantation apparatus comprising:
    a beamline device configured to transport an ion beam with which a wafer is irradiated;
    a first angle measuring instrument configured to measure angle information on the ion beam in a first direction perpendicular to a beam traveling direction, wherein the first angle measuring instrument includes a first slit in which the first direction coincides with a first width direction of the first slit and a first charge detection unit for measuring angular distribution in the first direction of a beam component passing through the first slit;

a second angle measuring instrument configured to measure angle information on the ion beam in a second direction perpendicular to the beam traveling direction and crossing the first direction, wherein the second angle measuring instrument has a second slit in which the second direction coincides with a second width direction of the second slit and a second charge detection unit for measuring angular distribution in the second direction of a beam component passing through the second slit;

a relative movement mechanism configured to change relative positions of the first angle measuring instrument and the second angle measuring instrument with respect to the ion beam in a predetermined relative movement direction perpendicular to the beam traveling direction and not perpendicular to both the first direction and the second direction, wherein the relative movement mechanism is a beam deflection device deflecting the ion beam in the relative movement direction.

13. The ion implantation apparatus according to claim 12, wherein the beam deflection device is a beam scanner for conducting reciprocating scan with the ion beam during beam irradiation to the wafer.

14. A method for measuring angle information on an ion beam with a measurement device, the measurement device comprising:

a first angle measuring instrument configured to measure angle information on the ion beam in a first direction perpendicular to a beam traveling direction, wherein the first angle measuring instrument includes a first slit in which the first direction coincides with a first width direction of the first slit and a first charge detection unit for measuring angular distribution in the first direction of a beam component passing through the first slit;

a second angle measuring instrument configured to measure angle information on the ion beam in a second direction perpendicular to the beam traveling direction and crossing the first direction, wherein the second angle measuring instrument has a second slit in which the second direction coincides with a second width direction and a second charge detection unit for measuring angular distribution in the second direction of a beam component passing through the second slit, the method comprising:

changing relative positions of the first angle measuring instrument and the second angle measuring instrument with respect to the ion beam in a predetermined relative movement direction perpendicular to the beam traveling direction and not perpendicular to both the first direction and the second direction; and calculating the angle information on the ion beam in a third direction perpendicular to both the beam traveling direction and the relative movement direction based on the angle information on the ion beam in the first direction measured by the first angle measuring instrument while changing the relative position of the first angle measuring instrument with respect to the ion beam and on the angle information on the ion beam in the second direction measured by the second angle measuring instrument while changing the relative position of the second angle measuring instrument with respect to the ion beam.

15. The method according to claim 14, wherein the angle information on the ion beam in the third direction is calculated by a vector operation based on the angle information on the ion beam in the first direction and the angle information on the ion beam in the second direction.

16. The method according to claim 14, further comprising:

calculating two-dimensional angular distribution information on the ion beam based on the angle information on the ion beam in the first direction and the angle information on the ion beam in the second direction.

17. The method according to claim 14, further comprising:

calculating angle information on the ion beam in a beam scanning direction in which reciprocating scan with the ion beam is conducted during beam irradiation to the wafer, and angle information on the ion beam in a reciprocating direction in which the wafer reciprocates during beam irradiation to the wafer, based on the angle information on the ion beam in the first direction and the angle information on the ion beam in the second direction.

18. The method according to claim 14, wherein at least one of the first angle measuring instrument or the second angle measuring instrument is divided into a plurality of angle measurement units disposed side by side in the third direction, wherein each of the plurality of angle measurement unit has a slit and a charge detector for measuring angular distribution of a beam component passing through the slit, and the method further comprises calculating at least one of the angle information on the ion beam in the first direction or the angle information on the ion beam in the second direction by integrating partial angle information on the ion beam respectively measured by the plurality of angle measurement units.

* * * * *